(12) United States Patent
Sato et al.

(10) Patent No.: US 12,738,461 B2
(45) Date of Patent: Sep. 15, 2026

(54) SEAL STRUCTURE, SUBSTRATE PROCESSING APPARATUS, SUBSTRATE PROCESSING METHOD AND METHOD OF MANUFACTURING SEMICONDUCTOR DEVICE

(71) Applicant: Kokusai Electric Corporation, Tokyo (JP)

(72) Inventors: Takayuki Sato, Toyama (JP); Tetsuaki Inada, Toyama (JP); Kenta Sasaki, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 627 days.

(21) Appl. No.: 18/181,620

(22) Filed: Mar. 10, 2023

(65) Prior Publication Data

US 2023/0274916 A1 Aug. 31, 2023

Related U.S. Application Data

(63) Continuation of application No. PCT/JP2021/033341, filed on Sep. 10, 2021.

(30) Foreign Application Priority Data

Sep. 23, 2020 (JP) ................................ 2020-159107

(51) Int. Cl.

| | |
|---|---|
| ***H01J 37/32*** | (2006.01) |
| ***H10P 14/60*** | (2026.01) |
| ***H10P 72/00*** | (2026.01) |

(52) U.S. Cl.

CPC .... *H01J 37/32513* (2013.01); *H10P 14/6304* (2026.01); *H10P 72/0402* (2026.01);

(Continued)

(58) Field of Classification Search

None

See application file for complete search history.

(56) References Cited

U.S. PATENT DOCUMENTS

| | | | | |
|---|---|---|---|---|
| 5,085,887 A * | 2/1992 | Adams | .................. | C23C 16/481 118/724 |
| 5,965,048 A * | 10/1999 | Powers | .................... | C21D 1/74 219/385 |

(Continued)

FOREIGN PATENT DOCUMENTS

| | | |
|---|---|---|
| JP | H01120330 U | 8/1989 |
| JP | H0479421 U | 7/1992 |

(Continued)

OTHER PUBLICATIONS

Office Action with English translation in Taiwan Application No. 110130825, dated May 11, 2023, 14 pages.

(Continued)

*Primary Examiner* — Binu Thomas

(74) *Attorney, Agent, or Firm* — Edell, Shapiro & Finnan, LLC

(57) ABSTRACT

According to one aspect of the technique of the present disclosure, there is provided a seal structure capable of sealing a space between a first structure heated by a heater and a second structure arranged so as to face the first structure, the seal structure including: a metal plate arranged in contact with the first structure; and a sealing material made of a resin material and arranged in contact with the metal plate and the second structure, wherein the space between the first structure and the second structure is sealed by the metal plate and the sealing material.

19 Claims, 5 Drawing Sheets

(52) U.S. Cl.
CPC ...... *H10P 72/0436* (2026.01); *H10P 72/0462* (2026.01); *H01J 2237/2001* (2013.01); *H01J 2237/338* (2013.01)

(56) References Cited

U.S. PATENT DOCUMENTS

| | | | | |
|---|---|---|---|---|
| 6,352,593 | B1 * | 3/2002 | Brors | H01L 21/67115 118/724 |
| 2016/0284573 | A1 * | 9/2016 | Nishide | H01L 21/67115 |

FOREIGN PATENT DOCUMENTS

| | | | |
|---|---|---|---|
| JP | 05-149433 | A | 6/1993 |
| JP | 07-045549 | A | 2/1995 |
| JP | 09-326366 | A | 12/1997 |
| JP | 2003-124206 | A | 4/2003 |
| JP | 2005-183645 | A | 7/2005 |
| JP | 2008-177524 | A | 7/2008 |
| JP | 2011-256946 | A | 12/2011 |

OTHER PUBLICATIONS

Request for the Submission of an Opinion with English translation in Korean Application No. 10-2023-7008161, dated May 31, 2024, 12 pages.

Notice of Reasons for Refusal with English translation in Japanese Application No. 2022-551881, dated Jul. 26, 2023, 8 pages.

* cited by examiner

SEAL STRUCTURE, SUBSTRATE PROCESSING APPARATUS, SUBSTRATE PROCESSING METHOD AND METHOD OF MANUFACTURING SEMICONDUCTOR DEVICE

CROSS REFERENCE TO RELATED APPLICATIONS

This application is a continuation application of PCT International Application No. PCT/JP2021/033341, filed on Sep. 10, 2021, in the WIPO, the international application being based upon and claiming the benefit of priority from Japanese Patent Application No. 2020-159107, filed on Sep. 23, 2020, in the Japanese Patent Office, the entire contents of which are hereby incorporated by reference.

TECHNICAL FIELD

The present disclosure relates to a seal structure, a substrate processing apparatus, a substrate processing method and a method of manufacturing a semiconductor device.

BACKGROUND

When forming a pattern of a semiconductor device such as a flash memory, a step of performing a predetermined process such as an oxidation process and a nitridation process on a substrate may be performed as a part of a manufacturing process of the semiconductor device.

For example, according to some related arts, a surface of the pattern formed on the substrate is modified by using a plasma-excited process gas. A gas supplier (which is a gas supply structure or a gas supply system) is provided at an upper portion of a process chamber such that a reactive gas is capable of being supplied into the process chamber through the gas supplier.

A substrate processing apparatus according to some related arts may be provided with a seal structure to prevent a gas (such as the process gas and the reactive gas) from being mixed or leaked in the substrate processing apparatus. However, from the viewpoint of a heat resistance of a sealing material of the seal structure, it is not preferable for a large amount of a heat emitted from a heater provided in the substrate processing apparatus to be transmitted to the sealing material.

SUMMARY

According to the present disclosure, there is provided a technique capable of suppressing heating of a sealing material due to a heat of a heater.

According to one aspect of the technique of the present disclosure, there is provided a seal structure capable of sealing a space between a first structure heated by a heater and a second structure arranged so as to face the first structure, the seal structure including: a metal plate arranged in contact with the first structure; and a sealing material made of a resin material and arranged in contact with the metal plate and the second structure, wherein the space between the first structure and the second structure is sealed by the metal plate and the sealing material.

DETAILED DESCRIPTION

Figure 1:
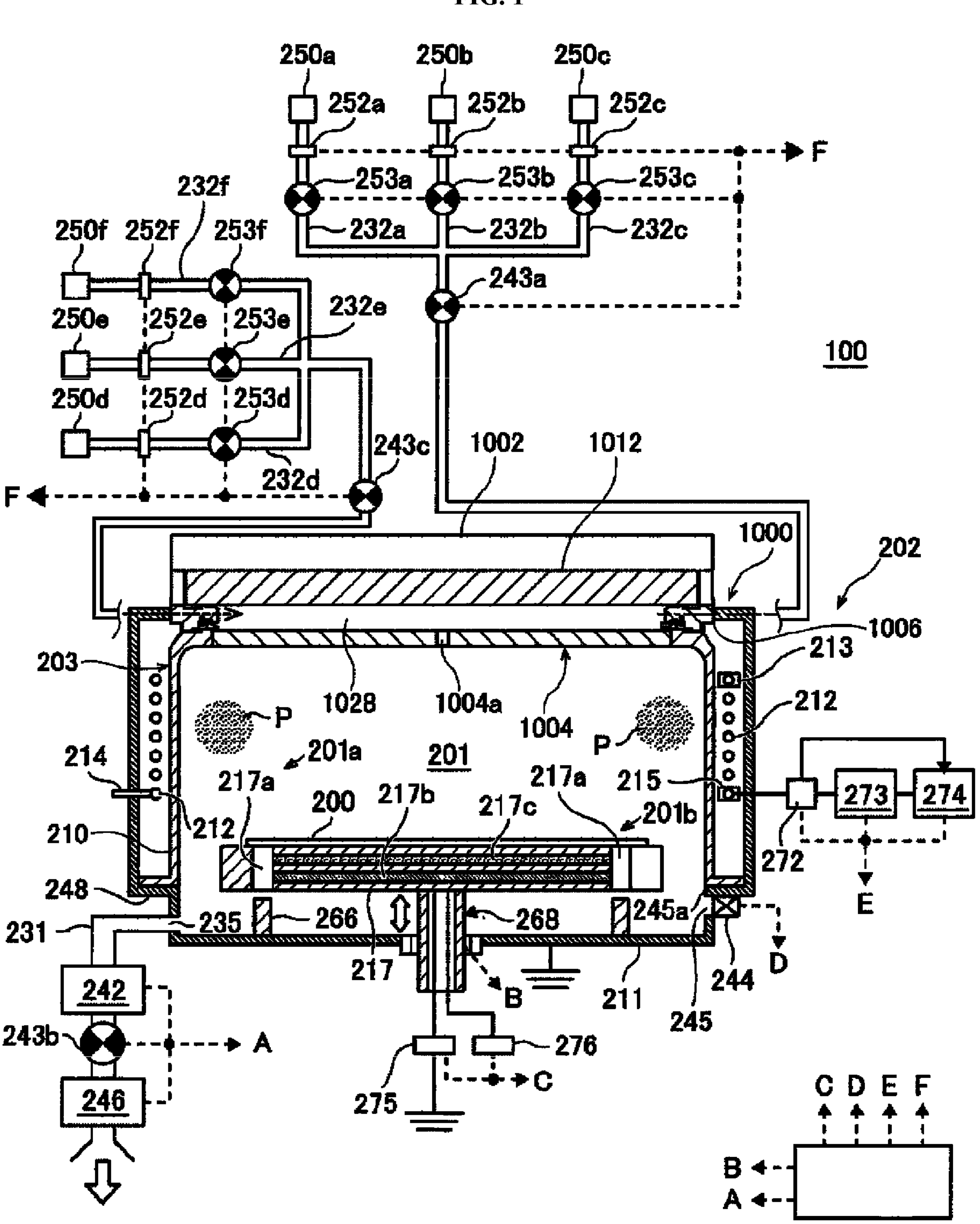
FIG. 1 is a diagram schematically illustrating a cross-section of a substrate processing apparatus according to one or more embodiments of the present disclosure.

Hereinafter, a substrate processing apparatus, a substrate processing method, a method of manufacturing a semiconductor device and a non-transitory computer-readable recording medium according to one or more embodiments (also simply referred to as "embodiments") of the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

Hereinafter, a configuration of a substrate processing apparatus 100 according to the present embodiments will be described with reference to FIG. 1. For example, the substrate processing apparatus 100 according to the present embodiments is configured to mainly perform an oxidation process on a film formed on a surface of a wafer (which serves as a substrate) 200. The substrate processing apparatus 100 includes a process chamber 201, a heating structure, a plate 1004 serving as a first structure, a manifold 1006 and a seal structure 1000.

The heating structure is configured to be capable of heating an inside of the process chamber 201. For example, the heating structure is constituted by a lamp heater 1002 and a heater **217*b* provided in a susceptor 217, which are described later. For example, the heater 217*b* includes a resistance heater capable of generating a heat by an electric resistance of the heater 217*b*** itself. The heating structure may be simply referred to as a "heater".

For example, the plate 1004 refers to a structure constituting a first gas supplier (which is a first gas supply structure or a first gas supply system) and a second gas supplier (which is a second gas supply structure or a second gas supply system), which are described later. For example, the plate 1004 is provided between the lamp heater 1002 and the process chamber 201 in which the wafer 200 serving as the substrate is processed. The plate 1004 is configured to be capable of transmitting a radiant heat from the lamp heater 1002 into the process chamber 201. For example, at least a part of the plate 1004 is made of quartz (transparent quartz) which is a non-metallic transparent material.

The manifold 1006 is arranged so as to face the plate 1004. The plate 1004 and the manifold 1006 are arranged without contacting each other. Thereby, in a case where the plate 1004 is made of quartz and the manifold 1006 is made of a metal, it is possible to prevent the plate 1004 from being damaged due to a contact between the plate 1004 and the manifold 1006.

For example, the seal structure 1000 refers to a structure capable of sealing a space between the plate 1004 and the manifold 1006.

<Process Chamber>

The substrate processing apparatus 100 includes a process furnace 202 in which the wafer 200 serving as the substrate is processed by using a plasma. The process furnace 202 is provided with a process vessel 203 constituting the process chamber 201. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. For example, the upper vessel 210 is made of a non-metallic material such as quartz ($SiO2$), and the lower vessel 211 is made of a metal such as aluminum (Al).

In addition, a gate valve 244 is provided on a lower side wall of the lower vessel 211. While the gate valve 244 is open, the wafer 200 can be transferred (or loaded) into the process chamber 201 through a loading/unloading port 245 by using a transfer structure (which is a transfer device) (not shown) or can be transferred (or unloaded) out of the process chamber 201 through the loading/unloading port 245 by using the transfer structure. While the gate valve 244 is closed, the gate valve 244 maintains the process chamber 201 airtight.

For example, the process chamber 201 includes a plasma generation space 201*a* and a substrate processing space 201*b*. A resonance coil 212 is provided around the plasma generation space 201*a*. The substrate processing space 201*b* communicates with the plasma generation space 201*a*, and the wafer 200 is processed in the substrate processing space 201*b*. The plasma generation space 201*a* refers to a space in which the plasma is generated, for example, a space above a lower end of the resonance coil 212 and below an upper end of the resonance coil 212 in the process chamber 201. In addition, the substrate processing space 201*b* refers to a space in which the substrate (that is, the wafer 200) is processed by the plasma, for example, a space below the lower end of the resonance coil 212. According to the present embodiments, a horizontal diameter of the plasma generation space 201*a* in a horizontal direction is set to be substantially the same as a horizontal diameter of the substrate processing space 201*b* in the horizontal direction.

<Susceptor>

The susceptor 217 is provided at a center of a bottom portion of the process chamber 201. The susceptor 217 constitutes a substrate mounting table (or a substrate support) on which the wafer 200 is placed. For example, the susceptor 217 is made of a non-metallic material such as aluminum nitride (AlN), ceramics and quartz.

The heater 217*b* serving as a part of the heating structure is integrally embedded in the susceptor 217. The heater 217*b* is configured to heat the wafer 200 such that the surface of the wafer 200 is heated to a temperature within a range from 25° C. to 750° C. when an electric power is supplied to the heater 217*b*.

The susceptor 217 is electrically insulated from the lower vessel 211. An impedance adjusting electrode 217*c* is provided in the susceptor 217. The impedance adjusting electrode 217*c* is grounded via a variable impedance regulator 275 serving as an impedance adjusting structure. For example, the variable impedance regulator 275 is constituted by components such as a coil (not shown) and a variable capacitor (not shown). The variable impedance regulator 275 is configured to change an impedance of the impedance adjusting electrode 217*c* by controlling an inductance and resistance of the coil (not shown) and a capacitance value of the variable capacitor (not shown). Thereby, it is possible to control the electric potential (bias voltage) of the wafer 200 via the impedance adjusting electrode 217*c* and the susceptor 217. However, according to the present embodiments, it is possible to appropriately select whether or not to perform a bias voltage control by using the impedance adjusting electrode 217*c*.

A susceptor elevator 268 including a driver (which is a driving structure) capable of elevating and lowering the susceptor 217 is provided at the susceptor 217. In addition, a plurality of through-holes 217*a* are provided at the susceptor 217, and a plurality of wafer lift pins 266 are provided at a bottom surface of the lower vessel 211 at locations corresponding to the plurality of through-holes 217*a*. For example, at least three of the through-holes 217*a* and at least three of the wafer lift pins 266 are provided at positions facing one another. When the susceptor 217 is lowered by the susceptor elevator 268, the wafer lift pins 266 pass through the through-holes 217*a*.

The substrate mounting table (or the substrate support) according to the present embodiments is constituted mainly by the susceptor 217, the heater 217*b* and the impedance adjusting electrode 217*c*.

<First Gas Supplier>

Figure 4:
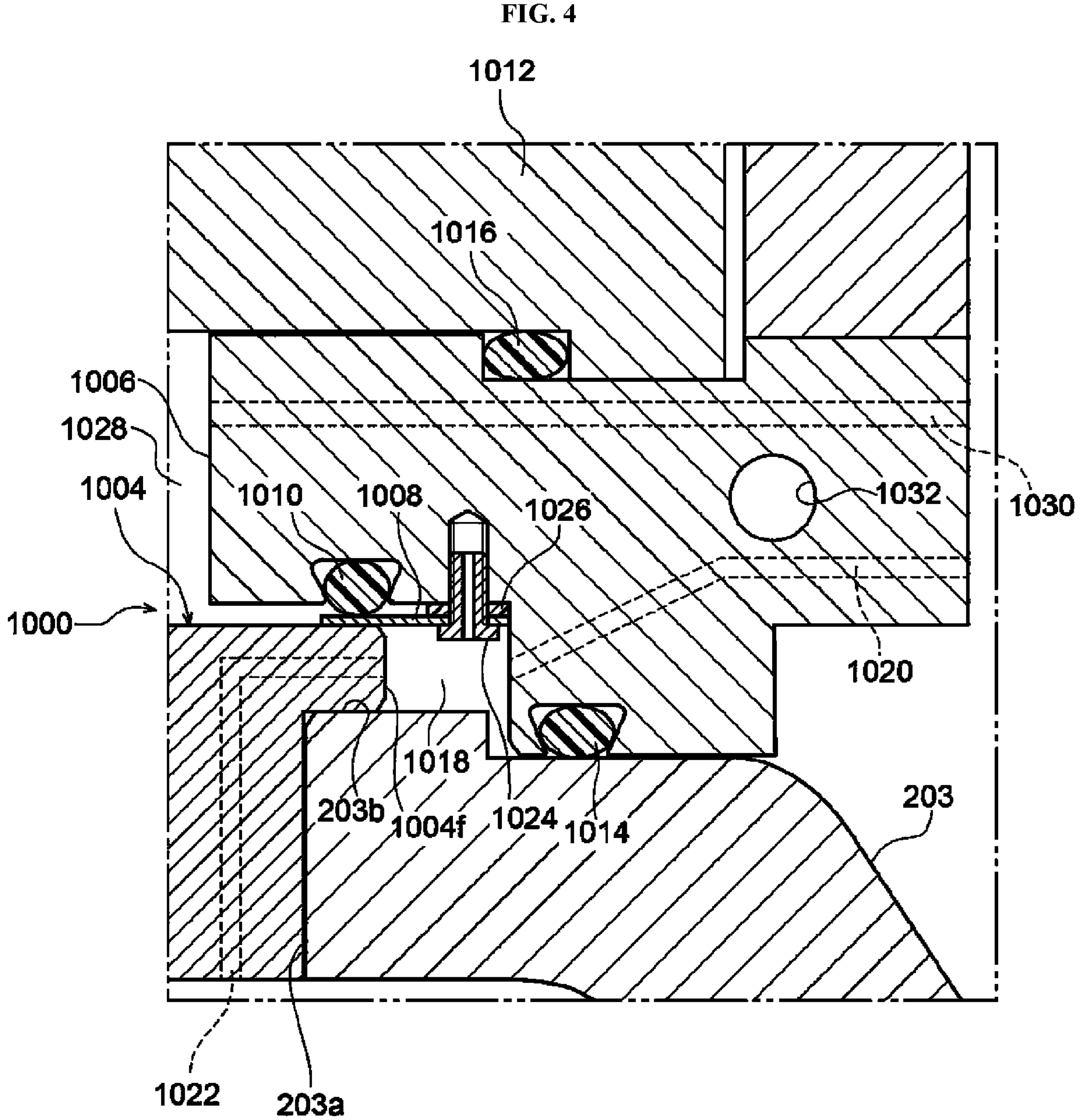
FIG. 4 is an enlarged view schematically illustrating a cross-section of a part of a seal structure according to the embodiments of the present disclosure.

Hereinafter, a gas supplied through the first gas supplier is also referred to a "first gas". The plate 1004 is provided above a center of the process chamber 201. As shown in FIG. 4, the manifold 1006 is arranged on an edge (periphery) of the plate 1004 so as to face the plate 1004 in a vertical direction.

As shown in FIG. 4, the plate 1004 is placed on an edge (periphery) 203*b* of an upper opening 203*a* of the process vessel 203. Specifically, a flange 1004*f* is provided on the edge of the plate 1004, and the plate 1004 is placed on the edge 203*b* by engaging the flange 1004*f* with the edge 203*b*. A main portion of the plate 1004 other than the flange 1004*f* is arranged so as to close the upper opening 203*a*.

The manifold 1006 is provided on the process vessel 203. A space between the manifold 1006 and the process vessel 203 is sealed by an O-ring 1014. A lid 1012 made of a material such as transparent quartz is provided above the manifold 1006. A space between the manifold 1006 and the lid 1012 is sealed by an O-ring 1016. The lamp heater 1002 is provided on the lid 1012. The radiant heat from the lamp heater 1002 reaches an inside of the process chamber 201 through the lid 1012 and the plate 1004.

The plate 1004 is heated by the lamp heater 1002 and the heater 217*b*. Further, the plate 1004 may be indirectly heated by, for example, a heat conduction from the process vessel 203 with which the plate 1004 is in contact. In addition, the plate 1004 may be heated by the plasma generated by a plasma generator described later.

A first buffer space 1018 to which the first gas is supplied is defined by the flange 1004*f* of the plate 1004, the process vessel 203, the manifold 1006, and a metal plate 1008 described later. The first buffer space 1018 is of an annular shape, and is provided around the plate 1004. When a substrate processing described later is being performed (that is, when the wafer 200 is being processed), the first buffer space 1018 is in a decompressed state. The first gas is supplied to the first buffer space 1018 through a gas introduction path 1020 provided in the manifold 1006. A first gas ejection port 1022 is provided in the plate 1004 such that the first gas can be supplied from the first buffer space 1018 into the process chamber 201 through the first gas ejection port 1022.

A downstream end of an oxygen-containing gas supply pipe 232*a* through which an oxygen-containing gas is supplied, a downstream end of a hydrogen-containing gas supply pipe 232*b* through which a hydrogen-containing gas is supplied and a downstream end of an inert gas supply pipe 232*c* through which an inert gas is supplied are connected to the gas introduction path 1020 so as to be conjoined with one another. An oxygen-containing gas supply source 250*a*, a mass flow controller (MFC) 252*a* serving as a flow rate controller and a valve 253*a* serving as an opening/closing valve are sequentially provided at the oxygen-containing gas supply pipe 232*a*. A hydrogen-containing gas supply source 250*b*, an MFC 252*b* and a valve 253*b* are sequentially provided at the hydrogen-containing gas supply pipe 232*b*. An inert gas supply source 250*c*, an MFC 252*c* and a valve 253*c* are sequentially provided at the inert gas supply pipe 232*c*. A valve 243*a* is provided on a downstream side of a location where the oxygen-containing gas supply pipe 232*a*, the hydrogen-containing gas supply pipe 232*b* and the inert gas supply pipe 232*c* join. The valve 243*a* is connected to an upstream end of the gas introduction path 1020. It is possible to supply process gases such as the oxygen-containing gas, the hydrogen-containing gas and the inert gas into the process chamber 201 via the oxygen-containing gas supply pipe 232*a*, the hydrogen-containing gas supply pipe 232*b* and the inert gas supply pipe 232*c* by opening and closing the valves 253*a*, 253*b*, 253*c* and 243*a* while adjusting flow rates of the respective gases by the MFCs 252*a*, 252*b* and 252*c*.

The first gas supplier (which is the first gas supply structure or the first gas supply system) according to the present embodiments is constituted mainly by the first gas ejection port 1022, the oxygen-containing gas supply pipe 232*a*, the hydrogen-containing gas supply pipe 232*b*, the inert gas supply pipe 232*c*, the MFCs 252*a*, 252*b* and 252*c* and the valves 253*a*, 253*b*, 253*c* and 243*a*. The first gas supplier is configured such that a gas (or a gaseous mixture) containing oxygen and serving as a source of an oxidizing species can be supplied into the process chamber 201 through the first gas supplier.

<Second Gas Supplier>

Hereinafter, a gas supplied through the second gas supplier is also referred to a "second gas". As shown in FIG. 1, a second buffer space 1028 to which the second gas is supplied is defined by the lid 1012, the plate 1004, the manifold 1006 and the metal plate 1008 (see FIG. 4) described later. When the substrate processing described later is being performed (that is, when the wafer 200 is being processed), the second buffer space 1028 is in a decompressed state. The second gas is supplied to the second buffer space 1028 through a gas introduction path 1030 provided in the manifold 1006. A second gas ejection port 1004*a* is provided in a central portion of the plate 1004 such that the second gas can be supplied from the second buffer space 1028 into the process chamber 201 through the second gas ejection port 1004*a*.

A downstream end of an oxygen-containing gas supply pipe 232*d* through which the oxygen-containing gas is supplied, a downstream end of a hydrogen-containing gas supply pipe 232*e* through which the hydrogen-containing gas is supplied and a downstream end of an inert gas supply pipe 232*f* through which the inert gas is supplied are connected to the gas introduction path 1030 so as to be conjoined with one another. An oxygen-containing gas supply source 250*d*, a mass flow controller (MFC) 252*d* and a valve 253*d* serving as an opening/closing valve are sequentially provided at the oxygen-containing gas supply pipe 232*d*. A hydrogen-containing gas supply source 250*e*, an MFC 252*e* and a valve 253*e* are sequentially provided at the hydrogen-containing gas supply pipe 232*e*. An inert gas supply source 250*f*, an MFC 252*f* and a valve 253*f* are sequentially provided at the inert gas supply pipe 232*f*. A valve 243*c* is provided on a downstream side of a location where the oxygen-containing gas supply pipe 232*d*, the hydrogen-containing gas supply pipe 232*e* and the inert gas supply pipe 232*f* join. The valve 243*c* is connected to an upstream end of the gas introduction path 1030. It is possible to supply the process gases such as the oxygen-containing gas, the hydrogen-containing gas and the inert gas into the process chamber 201 via the oxygen-containing gas supply pipe 232*d*, the hydrogen-containing gas supply pipe 232*e* and the inert gas supply pipe 232*f* by opening and closing the valves 253*d*, 253*e*, 253*f* and 243*c* while adjusting flow rates of the respective gases by the MFCs 252*d*, 252*e* and 252*f*.

The second gas supplier (which is the second gas supply structure or the second gas supply system) according to the present embodiments is constituted mainly by the second gas ejection port 1004*a*, the oxygen-containing gas supply pipe 232*d*, the hydrogen-containing gas supply pipe 232*e*, the inert gas supply pipe 232*f*, the MFCs 252*d*, 252*e* and 252*f* and the valves 253*d*, 253*e*, 253*f* and 243*c*. The second gas supplier is configured such that a hydrogen concentration adjusting gas (or a gaseous mixture) containing hydrogen for adjusting a concentration of hydrogen can be supplied into the process chamber 201 through the second gas supplier.

The first gas supplier is configured such that the first gas can be supplied to an outer peripheral region (which is a first region within the plasma generation space 201*a* described later extending along an inner wall of the process chamber 201) through the first gas supplier. Further, the second gas supplier is configured such that the second gas can be supplied to a central region (which is a second region within the plasma generation space 201*a* and surrounded by the outer peripheral region) through the second gas supplier.

According to the first gas supplier and the second gas supplier, it is possible to adjust a mixing ratio (or a flow rate ratio) of the oxygen-containing gas and the hydrogen-containing gas or a total flow rate for each of the first gas and the second gas. Therefore, it is possible to adjust the mixing ratio or the total flow rate of the oxygen-containing gas and the hydrogen-containing gas supplied to each of the outer peripheral region and the central region in the process chamber 201.

<Exhauster>

A gas exhaust port 235 through which a gas such as a reactive gas is exhausted out of the process chamber 201 is provided on a side wall of the lower vessel 211. An upstream end of a gas exhaust pipe 231 is connected to the gas exhaust port 235. An APC (Automatic Pressure Controller) valve 242 serving as a pressure regulator (which is a pressure adjusting structure), a valve 243*b* serving as an opening/closing valve and a vacuum pump 246 serving as a vacuum exhaust apparatus are provided at the gas exhaust pipe 231.

An exhauster (which is an exhaust structure or an exhaust system) according to the present embodiments is constituted mainly by the gas exhaust port 235, the gas exhaust pipe 231, the APC valve 242 and the valve 243*b*. The exhauster may further include the vacuum pump 246.

<Plasma Generator>

The resonance coil 212 of a helical shape (which serves as a high frequency electrode) is provided around an outer circumference of the process chamber 201 (that is, around an outer portion of a side wall of the upper vessel 210) so as to surround the process chamber 201. An RF (Radio Frequency) sensor 272, a high frequency power supply 273 and a matcher (which is a matching structure) 274 configured to perform an impedance matching or an output frequency matching for the high frequency power supply 273 are connected to the resonance coil 212.

The high frequency power supply 273 is configured to supply a high frequency power (RF power) to the resonance coil 212. The RF sensor 272 is provided at an output side of the high frequency power supply 273. The RF sensor 272 is configured to monitor information of the traveling wave or reflected wave of the supplied high frequency power. The reflected wave of the RF power monitored by the RF sensor 272 is input to the matcher 274, and the matcher 274 is configured to adjust an impedance of the high frequency power supply 273 or a frequency of the high frequency power output from the high frequency power supply 273 so as to minimize the reflected wave based on the information of the reflected wave inputted from the RF sensor 272.

A winding diameter, a winding pitch and the number of winding turns of the resonance coil 212 are set such that the resonance coil 212 resonates at a constant wavelength to form a standing wave of a predetermined wavelength. That is, an electrical length of the resonance coil 212 is set to an integral multiple of a wavelength of a predetermined frequency of the high frequency power supplied from the high frequency power supply 273.

Specifically, considering conditions such as the power to be applied, a strength of a magnetic field to be generated and a shape of an apparatus such as the substrate processing apparatus 100 to which the power is to be applied to, the resonance coil 212 whose diameter is within a range from 200 mm to 500 mm is wound, for example, twice to 60 times around an outer circumference of the plasma generation space 201*a* such that the magnetic field can be generated by the high frequency power whose frequency is within a range from 800 kHz to 50 MHz and whose power is within a range from 0.1 KW to 5 KW. In the present specification, a notation of a numerical range such as “from 800 kHz to 50 MHz” means that a lower limit and an upper limit are included in the numerical range. Therefore, for example, a numerical range “from 800 kHz to 50 MHz” means a range equal to or higher than 800 kHz and equal to or less than 50 MHz. The same also applies to other numerical ranges described herein.

A shield plate 248 is provided as a shield against an electric field outside the resonance coil 212.

The plasma generator according to the present embodiments is constituted mainly by the resonance coil 212, the RF sensor 272 and the matcher 274. In addition, the plasma generator 1040 may further include the high frequency power supply 273.

With such a configuration, by supplying the high frequency power to the resonance coil 212, the plasma P of an annular shape is generated in the vicinity of the resonance coil 212 and in a region provided along an inner circumference of the process chamber 201. That is, the plasma P of the annular shape is generated in the outer peripheral region in the process chamber 201. According to the present embodiments, in particular, the plasma P of the annular shape is generated at a height where an electric midpoint of the resonance coil 212 is located, that is, at a middle height position between the upper end and the lower end of the resonance coil 212.

<Seal Structure>

In FIG. 4, the seal structure 1000 refers to the structure capable of sealing the space between the plate 1004 (which is the first structure) and the manifold 1006 (which is a second structure). The seal structure 1000 includes the metal plate 1008 and an O-ring 1010 serving as a sealing material made of a resin material. The space between the plate 1004 and the manifold 1006 is sealed by the metal plate 1008 and the O-ring 1010. The flange 1004*f* of the plate 1004 also serves as a contact portion in contact with the metal plate 1008. For example, the manifold 1006 is made of a metal.

For example, the resin material of the O-ring 1010 may include a rubber material such as a silicon rubber and a fluororubber. However, the resin material is not limited thereto. For example, other elastic resin materials serving as the sealing material may be used for forming the O-ring 1010. In addition, although the O-ring 1010 of the annular shape is used as the sealing material according to the present embodiments, a shape of the sealing material is not limited thereto. For example, the sealing material may be of a plate shape or a rod shape as long as it is suitable for serving as the sealing material.

The metal plate 1008 is of an annular shape, and is fixed in contact with the manifold 1006 at a position spaced apart from the O-ring 1010. Specifically, for example, the metal plate 1008 is fixed to the manifold 1006 by a fixing component such as a bolt 1024 made of a metal. A central portion of the bolt 1024 is axially threaded into a hole such that an atmosphere of the hole can be vacuum-exhausted. In the example shown in FIG. 4, a seal spacer 1026 is located between the metal plate 1008 and the manifold 1006. Even in such a case, the metal plate 1008 and the manifold 1006 are in contact via the bolt 1024. Since the metal plate 1008, the manifold 1006 and the bolt 1024 are made of a metal, the heat of the metal plate 1008 is transferred to the manifold 1006 via the bolt 1024. In addition, since the metal plate 1008 is fixed in contact with the manifold 1006 at the position spaced apart from the O-ring 1010, it is possible to prevent the O-ring 1010 from being heated by the heat transmitted from the metal plate 1008 to the manifold 1006.

It is preferable that the metal plate 1008 is thin in order to prevent a damage (or breakage) thereto in a case where the plate 1004 is made of quartz. Specifically, for example, a thickness of the metal plate 1008 is set to be a predetermined value within a range from 0.1 mm to 1.0 mm. When the thickness of the metal plate 1008 is less than 0.1 mm, a possibility that the metal plate 1008 itself is damaged may increase by contacting the plate 1004 or the bolt 1024. Further, since the heat is transmitted (or conducted) to the manifold 1006 and the bolt 1024, it is difficult to suppress a temperature elevation of the O-ring 1010. By setting the thickness of the metal plate 1008 to 0.1 mm or more, it is possible to prevent the metal plate 1008 itself from being damaged, and it is also possible to suppress the temperature elevation of the O-ring 1010. When the thickness of the metal plate 1008 exceeds 1.0 mm, since an elasticity of the metal plate 1008 is reduced, a possibility that the plate 1004 (which is made of quartz and in contact with the metal plate 1008) is damaged may increase. By setting the thickness of the metal plate 1008 to 1.0 mm or less, it is possible to maintain the elasticity of the metal plate 1008, and it is also possible to prevent the plate 1004 from being damaged. Further, the metal plate 1008 may be made of at least one of aluminum, a nickel alloy or a stainless steel.

For example, the seal spacer 1026 may be omitted. In such a case, since the metal plate 1008 is in direct planar contact with the manifold 1006, the heat of the metal plate 1008 is easily transferred to the manifold 1006.

When the metal plate 1008 is not provided, the O-ring 1010 is heated mainly by the flowing:

(a) the radiant heat emitted (or radiated) from at least one of the lamp heater 1002 or the heater 217*b* and transmitted through at least one of the plate 1004 and the process vessel 203;

(b) the radiant heat emitted (or radiated) from at least one of the heated plate 1004 or the process vessel 203; and (c) a conductive heat transferred from a contact surface with the hated plate 1004.

The metal plate 1008 is provided between the heater 217*b* and the O-ring 1010, and is arranged so as to shield the O-ring 1010 from the radiant heat emitted (or radiated) directly or indirectly from the heater 217*b* toward the O-ring 1010 from thereunder. Further, the metal plate 1008 is arranged so as to shield the O-ring 1010 from the radiant heat emitted (or radiated) directly or indirectly from the lamp heater 1002 (see FIG. 1) toward the O-ring 1010. That is, the metal plate 1008 is arranged so as to shield the O-ring from the heat sources (a) and (b) described above.

The manifold 1006 is cooled by a cooling structure. Specifically, the manifold 1006 is provided with a coolant channel 1032 serving as a part of the cooling structure. By supplying a coolant through the coolant channel 1032, it is possible to remove the heat of the manifold 1006. Thereby, it is possible to efficiently remove the heat of the metal plate 1008 through the manifold 1006. That is, the metal plate 1008 is arranged so as to insulate the O-ring 1010 from the heat source (c) described above.

Figure 5:
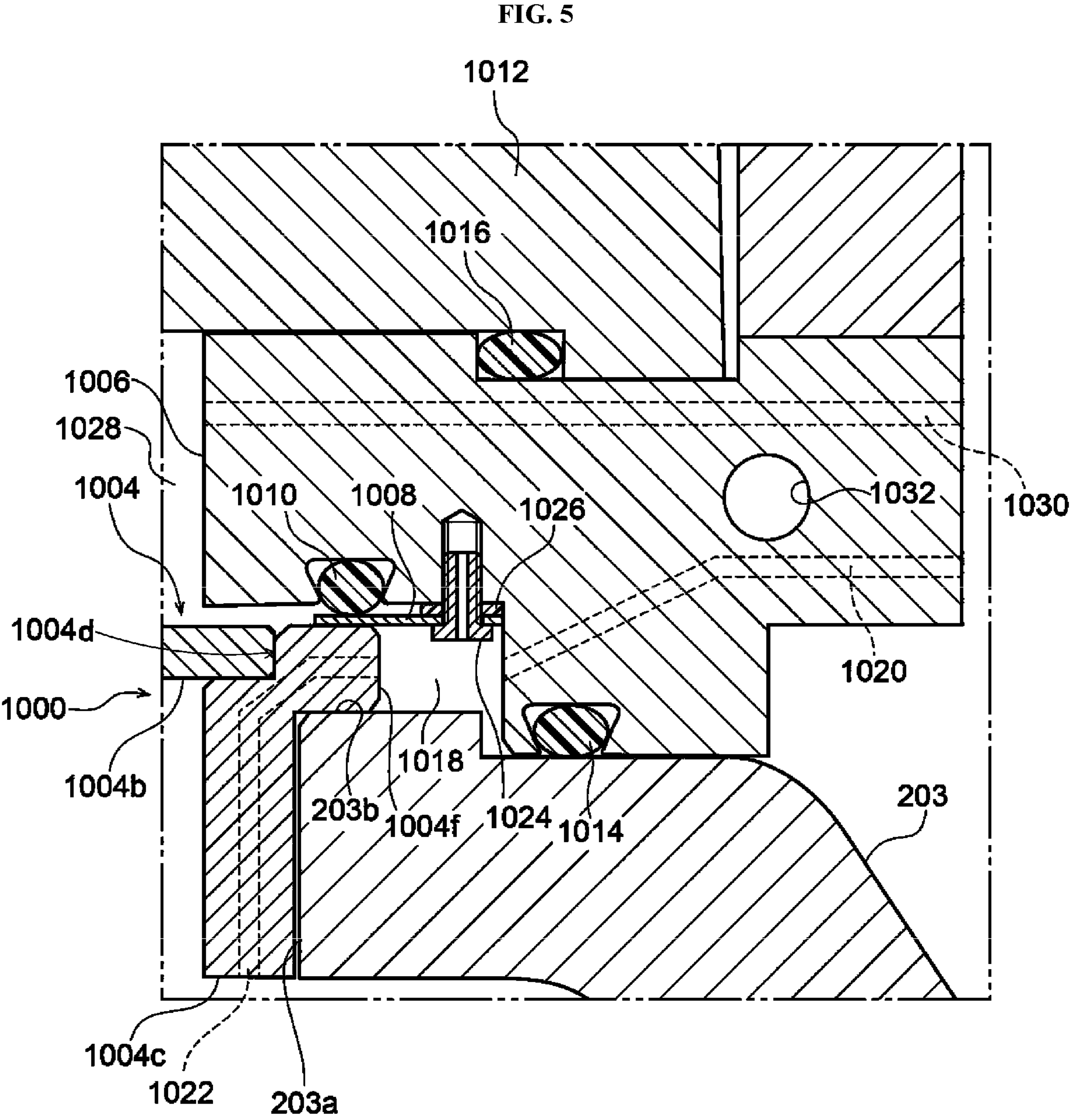
FIG. 5 is an enlarged view schematically illustrating a cross-section of a part of a seal structure according to a modified example of the embodiments of the present disclosure.

As shown in FIG. 5, for example, the plate 1004 may be configured by combining an inner peripheral portion 1004*b* and an outer peripheral portion 1004*c*. For example, the inner peripheral portion 1004*b* is a transparent portion made of transparent quartz. For example, the outer peripheral portion 1004*c* is of a cylindrical shape or of a ring shape, and is placed so as to be engaged with the edge 203*b* of the upper opening 203*a* of the process vessel 203. For example, the inner peripheral portion 1004*b* is of a disk shape, and is arranged in contact with a stepped portion 1004*d* of the outer peripheral portion 1004*c*. The outer peripheral portion 1004*c* also serves as a contact portion in contact with the metal plate 1008.

Further, the outer peripheral portion 1004*c* serves as an opaque portion made of an opaque material such as opaque quartz (which prevents the transmission of the radiant heat from the lamp heater 1002). By providing the outer peripheral portion 1004*c* (which serves as the contact portion) made of the opaque material, it is possible to reduce the radiant heat reaching the metal plate 1008, the O-ring 1010 and the manifold 1006 through the outer peripheral portion 1004*c*. In addition, by bringing the opaque portion into contact with the metal plate 1008, it is possible to prevent the O-ring 1010 from being heated by the opaque portion heated by the radiant heat.

<Controller>

A controller 221 serving as a control structure is configured to be capable of controlling the APC valve 242, the valve 243*b* and the vacuum pump 246 through a signal line "A", the susceptor elevator 268 through a signal line "B", a heater power regulator 276 and the variable impedance regulator 275 through a signal line "C", the gate valve 244 through a signal line "D", the RF sensor 272, the high frequency power supply 273 and the matcher 274 through a signal line "E", and the MFCs 252*a* through 252*f* and the valves 253*a* through 253*f*, 243*a* and 243*c* through a signal line "F".

Figure 2:
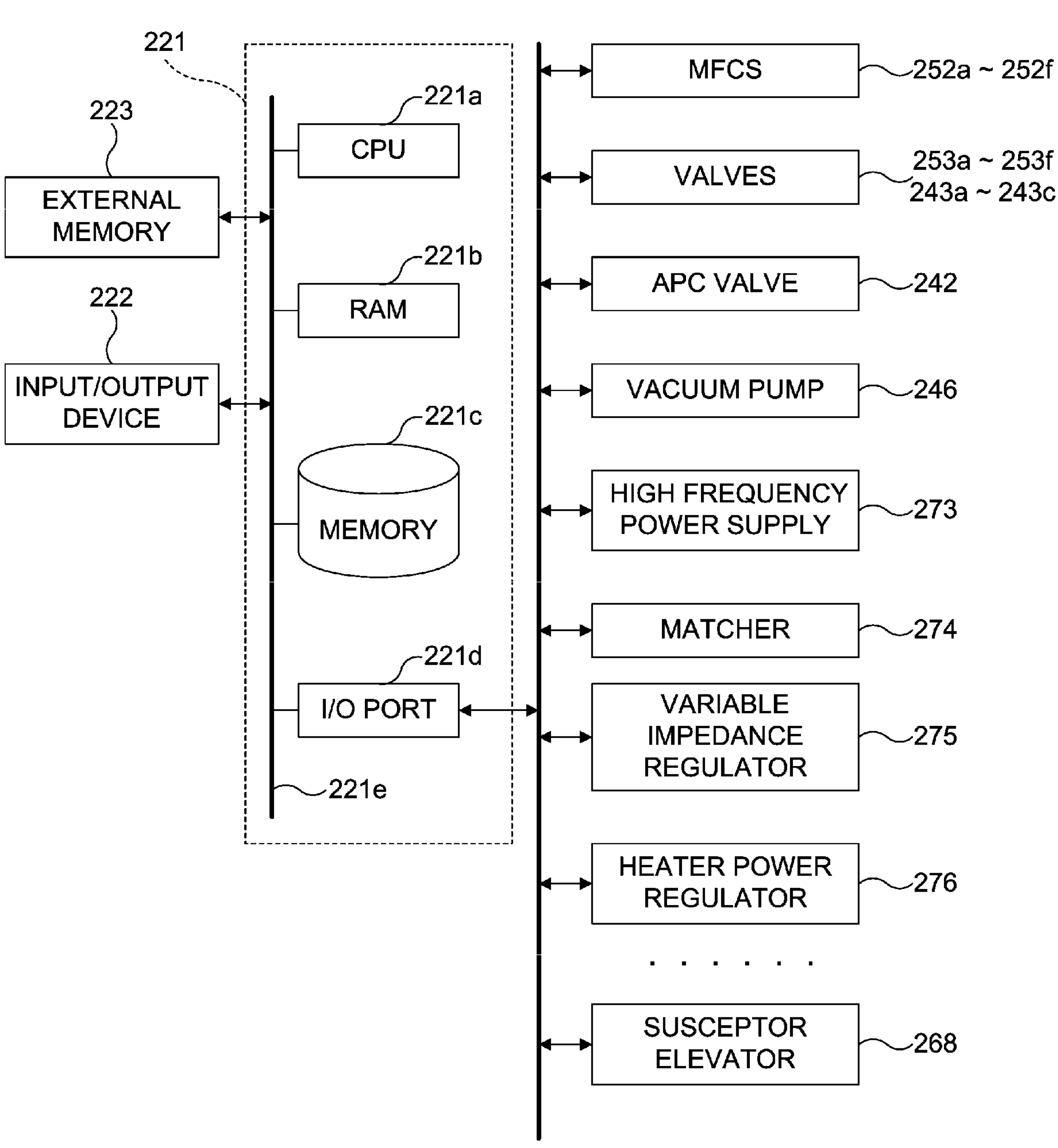
FIG. 2 is a block diagram schematically illustrating a configuration of a controller (which is a control structure) and related components of the substrate processing apparatus according to the embodiments of the present disclosure.

As shown in FIG. 2, the controller 221 serving as the control structure (control apparatus) is constituted by a computer including a CPU (Central Processing Unit) 221*a*, a RAM (Random Access Memory) 221*b*, a memory 221*c* and an I/O port 221*d*. The RAM 221*b*, the memory 221*c* and the I/O port 221*d* may exchange data with the CPU 221*a* through an internal bus 221*e*. For example, an input/output device 222 constituted by components such as a touch panel and a display may be connected to the controller 221.

The memory 221*c* may be embodied by a component such as a flash memory and a hard disk drive (HDD). For example, a control program configured to control operations of the substrate processing apparatus 100 and a process recipe in which information such as sequences and conditions of the substrate processing described later is stored may be readably stored in the memory 221*c*. The process recipe is obtained by combining steps of the substrate processing described later such that the controller 221 can execute the steps to acquire a predetermined result, and functions as a program. Hereinafter, the process recipe and the control program may be collectively or individually referred to as a "program". Thus, in the present specification, the term "program" may refer to the process recipe alone, may refer to the control program alone, or may refer to both of the process recipe and the control program. Further, the RAM 221*b* functions as a memory area (work area) where a program or data read by the CPU 221*a* is temporarily stored.

The I/O port 221*d* is electrically connected to the components described above such as the MFCs 252*a* through 252*f*, the valves 253*a* through 253*f*, 243*a*, 243*b* and 243*c*, the gate valve 244, the APC valve 242, the vacuum pump 246, the RF sensor 272, the high frequency power supply 273, the matcher 274, the susceptor elevator 268, the variable impedance regulator 275 and the heater power regulator 276.

The CPU 221*a* is configured to read and execute the control program stored in the memory 221*c*, and to read the process recipe stored in the memory 221*c* in accordance with an instruction such as an operation command inputted via the input/output device 222. The CPU 221*a* is configured to be capable of controlling the operations of the substrate processing apparatus 100 in accordance with the read process recipe. For example, the CPU 221*a* is configured to be capable of controlling various operations, in accordance with the process recipe, such as an operation of adjusting an opening degree of the APC valve 242, an opening and closing operation of the valve 243*b* and a start and stop of the vacuum pump 246 via the I/O port 221*d* and the signal line "A". Further, the CPU 221*a* is configured to be capable of controlling various operations, in accordance with the process recipe, such as an elevating and lowering operation of the susceptor elevator 268 via the I/O port 221*d* and the signal line "B". Further, the CPU 221*a* is configured to be capable of controlling various operations, in accordance with the process recipe, such as a power supply amount adjusting operation to the heater 217*b* by the heater power regulator 276 and an impedance value adjusting operation by the variable impedance regulator 275 via the I/O port 221*d* and the signal line "C". Further, the CPU 221*a* is configured to be capable of controlling various operations, in accordance with the process recipe, such as an opening and closing operation of the gate valve 244 via the I/O port 221*d* and the signal line "D". Further, the CPU 221*a* is configured to be capable of controlling various operations, in accordance with the process recipe, such as controlling operations of the RF sensor 272, the matcher 274 and the high frequency power supply 273 via the I/O port 221*d* and the signal line "E". Further, the CPU 221*a* is configured to be capable of controlling various operations, in accordance with the process recipe, such as flow rate adjusting operations for various gases by the MFCs 252*a* through 252*f* and opening and closing operations of the valves 253*a* through 253*f*, 243*a* and 243*c* via the I/O port 221*d* and the signal line "F".

The controller 221 may be embodied by installing the above-described program stored in an external memory 223 into a computer. For example, the external memory 223 may include a magnetic tape, a magnetic disk such as a flexible disk and a hard disk, an optical disk such as a CD and a DVD, a magneto-optical disk such as an MO and a semiconductor memory such as a USB memory and a memory card. The memory 221*c* or the external memory 223 may be embodied by a non-transitory computer readable recording medium. Hereafter, the memory 221*c* and the external memory 223 may be collectively or individually referred to as a "recording medium". Thus, in the present specification, the term "recording medium" may refer to the memory 221*c* alone, may refer to the external memory 223 alone, or may refer to both of the memory 221*c* and the external memory 223. The program may be provided to the computer without using the external memory 223. For example, the program may be supplied to the computer using a communication structure such as the Internet and a dedicated line.

<Method of Manufacturing Semiconductor Device>

Figure 3:
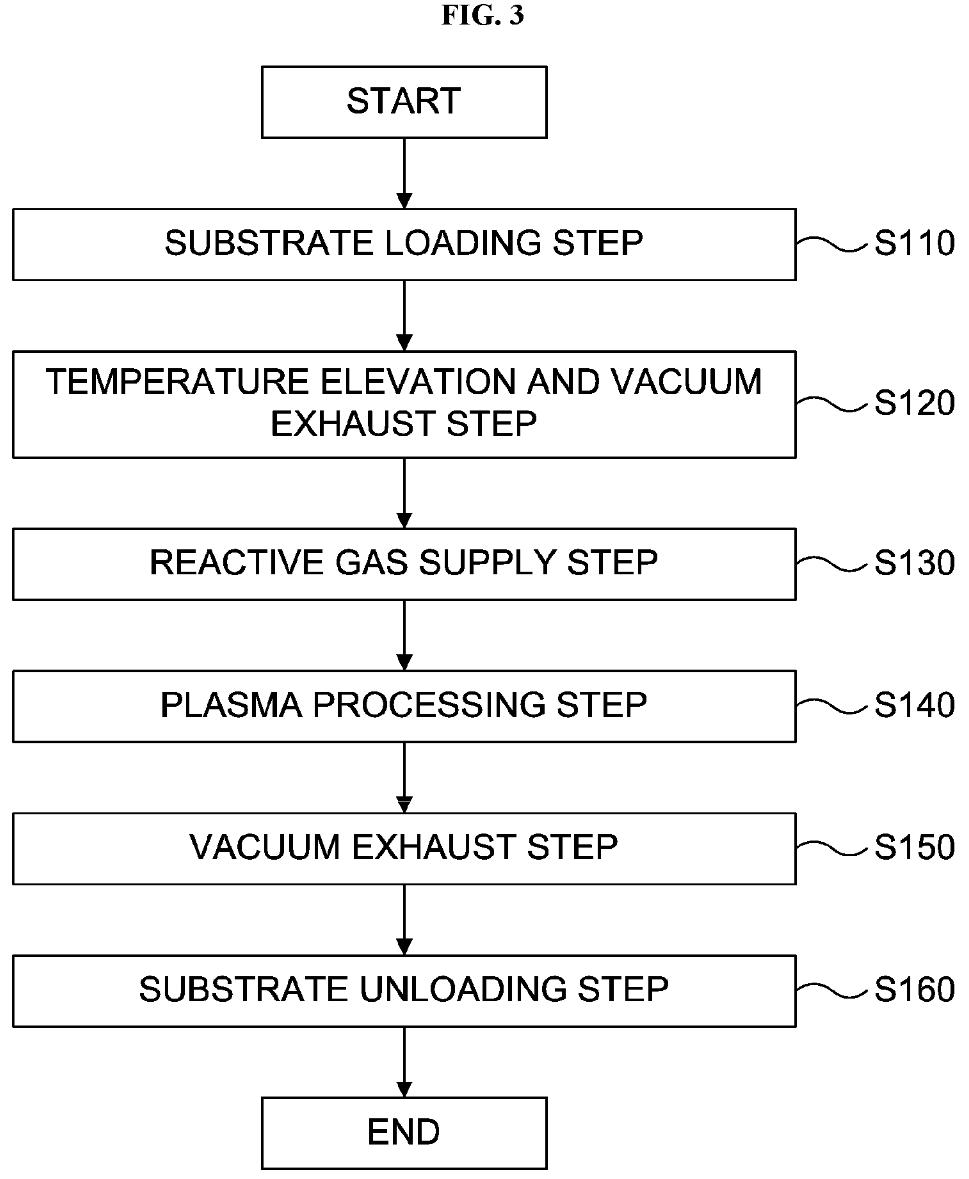
FIG. 3 is a flow chart schematically illustrating a substrate processing according to the embodiments of the present disclosure.

A method of manufacturing a semiconductor device according to the present embodiments may include: a step of transferring (or loading) the wafer 200 serving as the substrate into the process chamber 201 of the substrate processing apparatus 100 (for example, a substrate loading step S110 shown in FIG. 3); and a step of heating the wafer 200 by the heater (that is, the heating structure) such as the lamp heater 1002 (for example, a temperature elevation and vacuum exhaust step S120).

As described above, the substrate processing apparatus 100 includes: the process chamber 201 in which the wafer 200 is processed; the lamp heater 1002 serving as a part of the heating structure and configured to be capable of heating the inside of the process chamber 201; the plate 1004 serving as the first structure and heated by the lamp heater 1002; the manifold 1006 arranged so as to face the plate 1004; and the seal structure 1000 capable of sealing the space between the plate 1004 and the manifold 1006. The seal structure 1000 may include the metal plate 1008 for heat radiation disposed in contact with the plate 1004; and the O-ring 1010 serving as the sealing material made of the resin material and disposed in contact with the metal plate 1008 and the manifold 1006. The space between the plate 1004 and the manifold 1006 is sealed by the metal plate 1008 and the O-ring 1010.

(2) Substrate Processing

Subsequently, the substrate processing according to the present embodiments (which is a part of a manufacturing process of the semiconductor device such as a flash memory and which is performed by using the substrate processing apparatus 100 described above) will be described. The substrate processing will be described by way of an example in which a method of forming an oxide film by oxidizing the film formed on the surface of the wafer 200 is performed. In the following description, operations of the components constituting the substrate processing apparatus 100 are controlled by the controller 221.

<Substrate Loading Step S110>

First, the wafer 200 is transferred (or loaded) into the process chamber 201 and accommodated therein. Specifically, the susceptor 217 is lowered to a position of transferring the wafer 200 by the susceptor elevator 268. As a result, the wafer lift pins 266 protrude from the through-holes 217*a* by a predetermined height above a surface of the susceptor 217.

Subsequently, the gate valve 244 is opened, and the wafer 200 is transferred into the process chamber 201 using a wafer transfer structure (not shown) from a vacuum transfer chamber (not shown) provided adjacent to the process chamber 201. The wafer 200 loaded into the process chamber 201 is placed on and supported by the wafer lift pins 266 in a horizontal orientation. After the wafer 200 is loaded into the process chamber 201, the gate valve 244 is closed to hermetically seal (or close) the inside of the process chamber 201. Thereafter, by elevating the susceptor 217 using the susceptor elevator 268, the wafer 200 is placed on and supported by an upper surface of the susceptor 217.

<Temperature Elevation and Vacuum Exhaust Step S120>

Subsequently, a temperature of the wafer 200 loaded into the process chamber 201 is elevated. The heater 217*b* is heated in advance, and then the wafer 200 is heated to a predetermined temperature (for example, a temperature within a range from 150° C. to 750° C.) by placing the wafer 200 on the susceptor 217 where the heater 217*b* is embedded. The process chamber 201 is also heated by the lamp heater 1002. Further, while the wafer 200 is being heated, the vacuum pump 246 vacuum-exhausts an inner atmosphere of the process chamber 201 through the gas exhaust pipe 231 such that an inner pressure of the process chamber 201 reaches and is maintained at a predetermined pressure. The vacuum pump 246 is continuously operated at least until a substrate unloading step S160 described later is completed.

In the present step, as shown in FIG. 4, the space between the plate 1004 and the manifold 1006 is sealed by the metal plate 1008 and the O-ring 1010 in the seal structure 1000. Therefore, by arranging the metal plate 1008 between the O-ring 1010 and the plate 1004 heated by the heater (that is, the heating structure) such as the lamp heater 1002 and the O-ring 1010, it is possible to shield the radiant heat from the heater and the plate 1004 to the O-ring 1010. Further, it is possible to suppress the temperature elevation of the O-ring 1010 and it is also possible to suppress a deterioration due to the temperature elevation of the O-ring 1010.

As described above, the metal plate 1008 is of the annular shape, and is fixed in contact with the manifold 1006 at the position spaced apart from the O-ring 1010. Therefore, by conducting the heat of the metal plate 1008 to the manifold 1006, it is possible to suppress a temperature elevation of the metal plate 1008.

As described above, the manifold 1006 is cooled by the cooling structure. Therefore, by cooling the metal plate 1008 and the O-ring 1010 in contact with the manifold 1006, it is possible to suppress the temperature elevation of the O-ring 1010.

Moreover, the seal structure 1000 may be preferably used in a case where the first buffer space 1018 and the second buffer space 1028 are in the decompressed state. Even when a sealable pressure is reduced in a case where the metal plate 1008 is provided, by setting the first buffer space 1018 and the second buffer space 1028 to the decompressed (vacuum) state, it is possible to prevent the gas from being leaked between the first buffer space 1018 and the second buffer space 1028, and it is also possible to maintain the separation between the first buffer space 1018 and the second buffer space 1028.

<Reactive Gas Supply Step S130>

Subsequently, a supply of a mixed gas (the gaseous mixture), which serves as the first gas, of the oxygen-containing gas and the hydrogen-containing gas to the outer peripheral region of the process chamber 201 through the first gas supplier is started. Specifically, the valves 253*a* and 253*b* are opened, and a supply of the first gas into the process chamber 201 through the first gas ejection port 1022 is started while flow rates of the oxygen-containing gas and the hydrogen-containing gas (that is, a flow rate of the first gas) are adjusted by the MFCs 252*a* and 252*b*, respectively.

As the oxygen-containing gas, for example, a gas such as oxygen (O2) gas, nitrous oxide (N2O) gas, nitrogen monoxide (NO) gas, nitrogen dioxide (NO2) gas, ozone (O3) gas, water vapor (H2O) gas, carbon monoxide (CO) gas and carbon dioxide (CO2) gas may be used. Further, as the oxygen-containing gas, one or more of the gases described above may be used. As the hydrogen-containing gas, for example, a gas such as hydrogen (H2) gas, deuterium (D2) gas, the H2O gas and ammonia (NH3) gas may be used. Further, as the hydrogen-containing gas, one or more of the gases described above may be used. When the H2O gas is used as the oxygen-containing gas, it is preferable to use a gas other than the H2O gas as the hydrogen-containing gas, and when the H2O gas is used as the hydrogen-containing gas, it is preferable to use a gas other than the H2O as the oxygen-containing gas. As the inert gas, for example, nitrogen (N2) gas may be used. Further, in addition to or instead of the N2 gas, a rare gas such as argon (Ar) gas, helium (He) gas, neon (Ne) gas and xenon (Xe) may be used as the inert gas. Further, as the inert gas, one or more of the gases described above may be used.

By controlling the flow rates by the MFC 252*a* and the MFC 252*b*, it is possible to adjust at least one of the total flow rate of the first gas or a composition of the first gas (especially, a hydrogen content in the first gas). According to the present embodiments, it is possible to easily adjust the composition of the first gas by changing the mixing ratio (or the flow rate ratio) of the hydrogen-containing gas and the oxygen-containing gas.

In the present step, for example, the total flow rate of the first gas is set to be a predetermined flow rate, for example, within a range from 1,000 sccm to 10,000 sccm, and the flow rate of the oxygen-containing gas in the first gas is set to be a predetermined flow rate, for example, within a range from 20 sccm to 4,000 sccm. Further, the flow rate of the hydrogen-containing gas in the first gas is set to be a predetermined flow rate, for example, within a range from 20 sccm to 1,000 sccm. For example, a content ratio of the hydrogen-containing gas and the oxygen-containing gas contained in the first gas is set to be a predetermined value within a range from 0:100 to 95:5.

It is preferable to supply the first gas directly to the outer peripheral region of the process chamber 201 where the plasma P of the annular shape is generated in a plasma processing step S140 described later.

Simultaneously, a supply of a mixed gas (the gaseous mixture) (which serves as the second gas, that is, the hydrogen concentration adjusting gas) of the oxygen-containing gas and the hydrogen-containing gas to the central region of the process chamber 201 through the second gas supplier is started. Specifically, the valves 253*d* and 253*e* are opened, and the supply of the second gas into the process chamber 201 through the second gas ejection port 1004*a* provided in the central portion of the plate 1004 is started while the flow rates of the oxygen-containing gas and the hydrogen-containing gas (that is, a flow rate of the second gas) is adjusted by the MFCs 252*d* and 252*e*, respectively.

By controlling the flow rates by the MFC 252*d* and the MFC 252*e*, it is possible to adjust at least one of the total flow rate of the second gas or a composition of the second gas (especially, a hydrogen content in the second gas). Similar to the first gas, it is possible to easily adjust the composition of the second gas by changing the mixing ratio (or the flow rate ratio) of the oxygen-containing gas and the hydrogen-containing gas.

In the present step, for example, the total flow rate of the second gas is set to be equal to or less than the total flow rate of the first gas. For example, the total flow rate of the second gas is set to be a predetermined flow rate, for example, within a range from 100 sccm to 5,000 sccm, and the flow rate of the oxygen-containing gas in the second gas is set to be a predetermined flow rate, for example, within a range from 0 sccm to 5,000 sccm. Further, the flow rate of the hydrogen-containing gas in the second gas is set to be a predetermined flow rate, for example, within a range from 0 sccm to 5,000 sccm. According to the present embodiments, a ratio of the hydrogen-containing gas contained in the second gas (that is, the hydrogen content of the second gas) is set to be a predetermined value within a range from 0% to 100%. It is preferable that the total flow rate of the second gas is equal to or less than the total flow rate of the first gas.

<Control of Concentration Distribution of Hydrogen>

In the present step, by controlling at least one of the flow rate or the hydrogen content of each of the first gas and the second gas, it is possible to control a concentration distribution of hydrogen in the process chamber 201. The concentration distribution of hydrogen is controlled such that a density distribution of the oxidizing species in the plasma processing step S140 described later becomes a desired density distribution. The hydrogen content of the second gas is preferably adjusted to be different from the hydrogen content of the first gas. By using the second gas whose hydrogen content is different from that of the first gas, it is possible to individually control the flow rates of the first gas and the second gas. Thereby, it is also possible to easily control the concentration distribution of hydrogen in the process chamber 201.

For example, the inner atmosphere of the process chamber 201 is exhausted by adjusting the opening degree of the APC valve 242 such that the inner pressure of the process chamber 201 reaches and is maintained at a predetermined pressure, for example, within a range from 5 Pa to 260 Pa. In this manner, the first gas and the second gas are continuously supplied into the process chamber 201 while the inner atmosphere of the process chamber 201 is appropriately exhausted until the plasma processing step S140 described later is completed.

<Plasma Processing Step S140>

When the inner pressure of the process chamber 201 is stabilized, the high frequency power is supplied to the resonance coil 212 from the high frequency power supply 273. Thereby, a high frequency electric field is formed in the plasma generation space 201*a* to which the first gas is supplied, and a ring-shaped induction plasma (that is, the plasma P) whose density of the plasma is the highest is excited by the high frequency electric field at a height corresponding to the electric midpoint of the resonance coil 212 in the plasma generation space 201*a*. The first gas is plasma-excited and dissociates. As a result, the oxidizing species such as oxygen radicals containing oxygen, hydroxyl radicals (OH radicals), atomic oxygen (O), ozone (O3) and oxygen ions can be generated.

In the present step, the first gas is supplied to a plasma generation region (which is a region where the plasma is generated with a second plasma density). According to the present embodiments, the first gas is supplied to the plasma generation region (which is a region in which the ring-shaped plasma is excited and which is located in the outer peripheral region of the process chamber 201 near the resonance coil 212). Thereby, the oxidizing species described above can be generated mainly by the plasma excitation of the first gas.

On the other hand, in the present step, the second gas is supplied to a region where the plasma is generated at a first plasma density lower than the second plasma density or a plasma non-generation region which is a region where the plasma is not generated (that is, a region where the first plasma density is substantially zero (0)). That is, the second gas is supplied to a region whose plasma density is different from that of the first gas. According to the present embodiments, in particular, the second gas is supplied to the plasma non-generation region provided inside the ring-shaped plasma.

<Control of Density Distribution of Oxidizing Species>

In the present step, the oxidizing species generated by the plasma may lose or deteriorate in its ability (that is, may be deactivated) as the oxidizing species (or an oxidizing ability) when reacting with hydrogen in an atmosphere where the oxidizing species is present. Therefore, an attenuation rate (or an attenuation amount) of a density (or a concentration) of the oxidizing species in the atmosphere may change according to the concentration of hydrogen in the atmosphere where the oxidizing species is present. The higher the concentration of hydrogen, the greater the attenuation amount of the oxidizing species, and the lower the concentration of hydrogen, the lower the attenuation amount of the oxidizing species.

According to the present embodiments, when the oxidizing species generated in the plasma generation region diffuses in the plasma non-generation region, the oxidizing species may react with hydrogen in the plasma non-generation region and can be gradually deactivated. Therefore, it is possible to adjust the density of the oxidizing species diffusing in the plasma non-generation region by the concentration of hydrogen in the plasma non-generation region. That is, it is possible to appropriately adjust the density distribution of the oxidizing species in the plasma non-generation region by controlling the concentration distribution of hydrogen in the plasma non-generation region.

Specifically, by adjusting at least one of the flow rate or the hydrogen content of the second gas mainly supplied to the plasma non-generation region in the reactive gas supply step S130 described above, it is possible to control the concentration distribution of hydrogen on the surface of the wafer 200 in a direction corresponding to the surface of the wafer 200 within the plasma non-generation region. Further, by controlling the concentration distribution of hydrogen, it is possible to adjust the density distribution of the oxidizing species diffused in the space above the wafer 200. Thereby, it is possible to supply the oxidizing species to the surface of the wafer 200 in a state where the density distribution of the oxidizing species is adjusted in the direction corresponding to the surface of the wafer 200.

After a predetermined process time has elapsed (for example, 10 seconds to 900 seconds), a supply of the high frequency power from the high frequency power supply 273 is stopped to stop a plasma discharge in the process chamber 201. In addition, the valves 253*a*, 253*b*, 253*d* and 253*e* are closed to stop the supply of the first gas and the supply of the second gas into the process chamber 201. Thereby, the plasma processing step S140 is completed.

<Vacuum Exhaust Step S150>

After the supply of the first gas and the supply of the second gas are stopped, the inner atmosphere of the process chamber 201 is vacuum-exhausted through the gas exhaust pipe 231. As a result, the gas in the process chamber 201 such as the oxygen-containing gas, the hydrogen-containing gas and an exhaust gas generated by a reaction between the oxygen-containing gas and the hydrogen-containing gas is exhausted out of the process chamber 201. Thereafter, the opening degree of the APC valve 242 is adjusted such that the inner pressure of the process chamber 201 is adjusted to the same pressure as that of the vacuum transfer chamber (not shown) provided adjacent to the process chamber 201.

<Substrate Unloading Step S160>

Thereafter, the susceptor 217 is lowered to the position of transferring the wafer 200 until the wafer 200 is supported by the wafer lift pins 266. Then, the gate valve 244 is opened, and the wafer 200 is transferred (or unloaded) out of the process chamber 201 by using the wafer transfer structure (not shown). Thereby, the substrate processing according to the present embodiments is completed.

Other Embodiments of Present Disclosure

While the technique of the present disclosure is described in detail by way of the embodiments described above, the technique of the present disclosure is not limited thereto. The technique of the present disclosure may be modified in various ways without departing from the scope thereof.

The entire contents of Japanese Patent Application No. 2020-159107, filed on Sep. 23, 2020, are hereby incorporated in the present specification by reference. All documents, patent applications, and technical standards described herein are hereby incorporated in the present specification by reference to the same extent that the contents of each of the documents, the patent applications and the technical standards are specifically described.

According to some embodiments of the present disclosure, it is possible to suppress heating of the sealing material due to the heat of the heater (that is, the heating structure).

What is claimed is:

1. A seal structure capable of sealing a space between a first structure heated by a heater and a second structure arranged so as to face the first structure, the seal structure comprising:

a metal plate arranged in contact with the first structure; and a sealing material made of a resin material and arranged in contact with the metal plate and the second structure, wherein the space between the first structure and the second structure is sealed by the metal plate and the sealing material, wherein the metal plate and the sealing material are configured to separate a first buffer space and a second buffer space, and wherein the first buffer space to which a first gas is supplied is provided between the first structure and the second structure and the second buffer space to which a second gas is supplied is provided above the first structure.

2. The seal structure of claim 1, wherein the metal plate is fixed in contact with the second structure at a position spaced apart from the sealing material.

3. The seal structure of claim 1, wherein the second structure is cooled by a cooling structure.

4. The seal structure of claim 1, wherein the metal plate is arranged so as to shield the sealing material from a radiant heat emitted from the heater toward the sealing material.

5. The seal structure of claim 1, wherein the heater comprises a lamp heater.

6. The seal structure of claim 1, wherein the heater comprises a resistance heater.

7. The seal structure of claim 1, wherein the first structure is constituted by a plate provided between the heater and a process chamber in which a substrate is processed and being capable of transmitting a radiant heat from the heater into the process chamber.

8. The seal structure of claim 7, wherein the first structure comprises:

the plate; and a contact portion arranged in contact with the metal plate.

9. The seal structure of claim 1, wherein the metal plate and the sealing material are configured to separate the first buffer space in a decompressed state and the second buffer space in a decompressed state.

10. The seal structure of claim 1, wherein the first structure and the second structure are arranged without contacting each other.

11. The seal structure of claim 1, wherein the second structure is made of a metal.

12. The seal structure of claim 1, wherein the first structure is made of a non-metallic material.

13. The seal structure of claim 12, wherein at least a part of the first structure is made of transparent material.

14. The seal structure of claim 13, wherein the first structure is constituted by a transparent portion made of a transparent material capable of transmitting a radiant heat of the heater and an opaque portion made of an opaque material capable of preventing a transmission of the radiant heat of the heater.

15. The seal structure of claim 14, wherein the metal plate is arranged so as to be in contact with the opaque portion.

16. The seal structure of claim 1, wherein a thickness of the metal plate is set to be a predetermined value within a range from 0.1 mm to 1.0 mm.

17. A substrate processing apparatus comprising:

a process chamber in which a substrate is processed;

a heater configured to be capable of heating an inside of the process chamber;

a first structure heated by the heater;

a second structure arranged so as to face the first structure; and a seal structure capable of sealing a space between the first structure and the second structure, wherein the seal structure comprises:

a metal plate arranged in contact with the first structure; and a sealing material made of a resin material and arranged in contact with the metal plate and the second structure, wherein the space between the first structure and the second structure is sealed by the metal plate and the sealing material, wherein the metal plate and the sealing material are configured to separate a first buffer space and a second buffer space, and wherein the first buffer space to which a first gas is supplied is provided between the first structure and the second structure and the second buffer space to which a second gas is supplied is provided above the first structure.

18. A substrate processing method, comprising:

(a) loading a substrate into a process chamber of a substrate processing apparatus;

(b) heating the substrate by a heater of the substrate processing apparatus; and (c) supplying a first gas and a second gas into the process chamber, wherein the substrate processing apparatus comprises:

a first structure heated by the heater;

a second structure arranged so as to face the first structure; and a seal structure capable of sealing a space between the first structure and the second structure, and wherein the seal structure comprises:

a metal plate arranged in contact with the first structure; and a sealing material made of a resin material and arranged in contact with the metal plate and the second structure, wherein the space between the first structure and the second structure is sealed by the metal plate and the sealing material, wherein the metal plate and the sealing material are configured to separate a first buffer space and a second buffer space, and wherein the first buffer space to which the first gas is supplied is provided between the first structure and the second structure and the second buffer space to which the second gas is supplied is provided above the first structure.

19. A method of manufacturing a semiconductor device, comprising:

performing the method of claim 10; and forming a pattern of the semiconductor device on the substrate.

* * * * *